DECONTAMINATION PROCESS

Filed Feb. 26, 1960

Inventors:
John E. McNamara
Kenneth L. Keating
By: Mueller & Aichele Attys.

United States Patent Office 3,007,820
Patented Nov. 7, 1961

3,007,820
DECONTAMINATION PROCESS

John E. McNamara and Kenneth L. Keating, Phoenix, Ariz., assignors to Motorola, Inc., Chicago, Ill., a corporation of Illinois Filed Feb. 26, 1960, Ser. No. 11,288
6 Claims. (Cl. 148—13.1)

This invention relates to methods for decontaminating or purifying semiconductor materials. More particularly, the invention relates to methods of treating germanium bodies in order to remove undesirable conductivity modifying impurities from them.

In the production of certain types of semiconductor devices, particularly those adapted to high frequency applications, it is desirable to provide a body of germanium having a high resistivity substrate region, and an adjacent region of graded resistivity. The graded resistivity region is frequently made by the diffusion of certain desirable conductivity modifying impurities into a germanium die or wafer. The diffusion process involves heating of the germanium to an elevated temperature, often as high as 800° C. During such treatment, a significant number of undesirable conductivity modifying impurities are unintentionally but inevitably introduced into the germanium. These contaminating impurities may significantly alter the conductivity of the germanium. The contamination of the germanium may be so slight that the contaminant is not readily discoverable, and yet it damages the die or wafer to the extent that it is unsatisfactory for use in semiconductor devices.

The introduction of undesired conductivity modifying impurities into a semiconductor body by heating the body is known in the art as thermal contamination. When the introduction of the undesired impurities is effective to convert the material of the semiconductor body from its original conductivity type to a different conductivity type, the effect is known in the art as thermal conversion.

One proposed method of subsequently neutralizing or minimizing this effect is by heating the contaminated germanium in contact with potassium cyanide to remove the undesired impurities. The removal of the impurities takes place by a mechanism called leaching or out-diffusion. While this method has been generally effective, it has a number of serious drawbacks from the standpoint of practical commercial application. Potassium cyanide is an extremely poisonous material and creates a health hazard to those handling it. There are also special disposal problems created by the high toxicity of potassium cyanide. The germanium bodies must be coated with the potassium cyanide prior to the treatment or they must be immersed in a bath of molten cyanide. In either case, the treated germanium bodies must be washed several times in order to remove the cyanide after the decontamination treatment, and this slows down the manufacturing operation, particularly since this operation must be carried out very carefully because the potassium cyanide is so highly poisonous. In addition, the handling of the fragile germanium wafers during the coating and washing operation increases the chances of breaking the wafers.

Despite the disadvantages of the cyanide process, it has heretofore been a necessary step in transistor manufacture employing high resistivity germanium. Unless the thermally introduced impurities are removed, they can, for example, convert high resistivity N-type germanium or nearly intrinsic germanium to P-type material. As a result, quantities of processed germanium wafers are rendered useless for the application intended.

It is an object of this invention to provide a safe, economical and commercially practical method of treating germanium to remove undesired conductivity-modifying impurities therefrom.

It is another object of this invention to provide a combination of process steps whereby germanium can be provided with a region of graded resistivity by diffusion of desired impurities into the germanium, and whereby undesired impurities inadvertently introduced into the germanium during the diffusion can be removed.

It is still another object of the invention to provide materials which will effectively remove undesired impurities from a germanium body, and which can be handled more safely and efficiently than materials such as potassium cyanide which have previously been employed for this purpose.

A feature of the invention is the removal of undesired impurities from a body of germanium by heating such body in contact with a metal which has a strong affinity for the undesired impurities, which is substantially inert toward the germanium, and which can be handled safely and conveniently.

Another feature of the invention is the decontamination of a germanium wafer by heating it between layers of metal which remains solid during the processing. This provides a quick and easy decontamination method which requires a minimum of handling of the germanium wafer and thus reduces the chances of breakage.

Another feature of the invention is the provision of a method for decontaminating a germanium wafer in which the surface of the wafer is oxidized, and subsequently the wafer is heated with a molybdenum surface contacting the oxidized germanium surface, such that the molybdenum removes undesired conductivity modifying impurities from the germanium and the oxide surface prevents bonding of the molybdenum to the germanium.

Still another feature of the invention is the provision of a process whereby several thin germanium wafers are stacked between alternate layers of molybdenum foil, and the stack is heated in a furnace. This arrangement permits a large number of germanium wafers to be decontaminated in a relatively short time and contributes to an inincreased rate of production of semiconductor devices utilizing the germanium.

Figure 1:
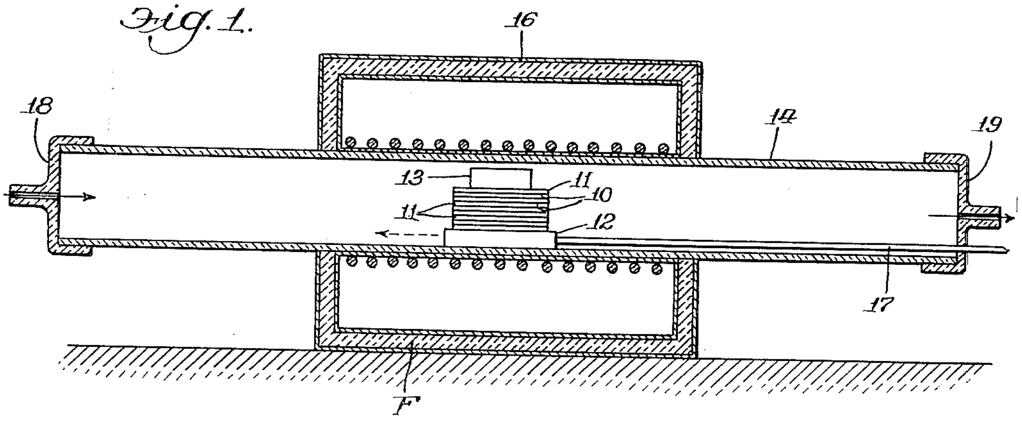
FIG. 1 is a sectional view showing a number of germanium wafers being decontaminated in a horizontal tube furnace in accordance with the present invention.

In accordance with this invention, germanium bodies which have been contaminated with small amounts of undesired impurities are decontaminated by heating them in contact with bodies of molybdenum. The molybdenum has a higher solubility for the contaminating impurities than the germanium. The surface of the germanium is first oxidized as by dipping the germanium bodies in nitric acid. The molybdenum and germanium bodies are then arranged as alternate layers in a stack, and the stack is heated to a temperature high enough to cause the contaminating impurities to diffuse out of the germanium and into the molybdenum. The oxide surface on the germanium bodies prevents fusion of the molybdenum and the germanium. The heating is continued for a time sufficient to reduce the concentration of the contaminating impurities in the germanium to an extent which renders the germanium satisfactory for use in the fabrication of semiconductor devices. The molybdenum and germanium bodies are then cooled slowly so as to avoid straining the germanium, and this may be followed by an annealing treatment.

In the manufacture of certain types of transistors useful at high frequencies, germanium having a layer of graded resistivity is provided by diffusing a donor-type impurity supplied in vapor phase into a wafer of high resistivity germanium. This diffusion operation involves the heating of germanium wafers to a temperature of about 800° C. in an atmosphere saturated with, for example, antimony vapor for a period of about 4½ hours. During the exposure of the germanium to this elevated temperature, the process of thermal contamination takes place. The result of thermal contamination is a net increase in the number of acceptor-type impurities in the germanium. If the germanium is high resistivity N-type or intrinsic material prior to diffusion, the contamination may change it to P-type material, and this effect is known as thermal conversion. It is believed that the principal cause of thermal contamination or conversion is copper which diffuses quite rapidly in comparison to antimony, and is therefore known as a fast-diffusing impurity. Thermal contamination takes place at temperatures above about 500° C. despite the most scrupulous efforts to exclude even the smallest quantities of copper from the surface of the diffusion system and the germanium. Iron and nickel are other fast-diffusing impurities, and these materials together with crystal dislocations and quenched-in impurities are believed to contribute to thermal contamination.

It has been found that the concentration of these fast-diffusing impurities in thermally contaminated germanium can be reduced significantly, such that the effects of the thermal contamination are neutralized or minimized, by placing the germanium in contact with molybdenum metal, and subjecting the metal and germanium to a heat treatment as discussed above. The molybdenum is effective to remove fast-diffusing impurities from the germanium at a temperature in the range of about 550° C. to 800° C.

After the diffusion treatment, the wafers which are to be decontaminated are first dipped in warm, dilute nitric acid for about 20 seconds, washed in deionized water, and blotted dry. The nitric acid dip oxidizes the surface of the germanium wafers, and the oxide film prevents bonding of the molybdenum metal to the germanium during the decontamination process. If the germanium surface is not oxidized, the molybdenum becomes bonded to the germanium during the decontamination treatment, and this makes it difficult to separate the germanium from the molybdenum. The desired oxidation will take place if the germanium wafers are exposed to air for about 24 hours following the diffusion treatment, but this is less convenient than the nitric acid dip referred to above.

The diffused germanium wafers 10 which have been treated with nitric acid are stacked sandwich-style between alternate layers 11 of molybdenum foil, as shown in FIG. 1. The foil contains substantially pure molybdenum in the free metal state. In a typical embodiment of the invention, each germanium wafer is about 1 inch in diameter and about 0.006 inch thick with the molybdenum foil being about 0.001 inch thick. The stack is placed on a quartz boat 12 and held in place by a molybdenum weight 13. The molybdenum and germanium are heated in contact with one another, and during this heat treatment the concentration of the undesired impurities in the germanium is reduced significantly.

It is believed that this is accomplished by out-diffusion wherein the undesired impurities diffuse out of the germanium and into the molybdenum. The molybdenum has a strong affinity for the fast-diffusing impurities named above because these impurities are considerably more soluble in molybdenum than in germanium. Thus, the molybdenum acts as a "chemical sink" which collects the undesired impurities. The molybdenum has little or no tendency to diffuse into the germanium, and it is not a conductivity modifying impurity in the germanium.

A convenient way of carrying out the out-diffusion process is in a horizontal tube 14 surrounded at its central portion by a furnace 16 as shown in FIG. 1. The furnace of FIG. 1 is electrically heated, but other types of heating may be employed. The germanium wafers 10 and molybdenum layers 11 arranged alternately in a stack are moved into the hot zone by means of the push rod 17 which is attached to the quartz boat 12 and is manipulated from outside the furnace. A non-oxidizing gas which is non-reactive with the molybdenum and germanium bodies, such as nitrogen or hydrogen, is passed through the furnace from the inlet end 18 to the outlet end 19. A positive flow of gas is used in order to remove combination products which might be formed by the reduction of any germanium oxide by the gas. The heat treatment may be carried out in any environment that is substantially non-reactive with molybdenum or germanium.

It has been found that copper or other fast-diffusing impurity material is effectively withdrawn from the germanium by the molybdenum at a temperature between about 550° C. and about 800° C. When treating germanium that has been subjected to a diffusion process, it is desirable that decontamination be carried out at a somewhat lower temperature than diffusion in order that the resistivity gradient established during diffusion will not be altered. In order to insure against alteration of the resistivity gradient established by diffusion, it is desirable that the decontamination temperature be at least about 50° C. below the diffusion temperature. Thus, if diffusion be carried out at 750° C. for example, subsequent decontamination should be carried out at a temperature not in excess of 700° C. Preferably, the decontamination is carried out at a temperature in the range of about 650° C. to about 700° C.

In general, decontamination takes longer at lower temperatures. The extreme lower limit of 550° C. given above represents the lowest temperature at which decontamination can be carried out in a practical time. At this temperature about two hours are required to effect decontamination. At a temperature of 700° C. only about a one-half hour heating period is necessary.

Subsequent to the heating period described above, the molybdenum and germanium stack is cooled to 475° C. in about one hour and then annealed at this temperature for about 4 hours. The purpose of this controlled cooling and annealing is to increase the lifetime of minority carriers in the germanium by relieving strains in the germanium body which can damage it.

Figure 2:
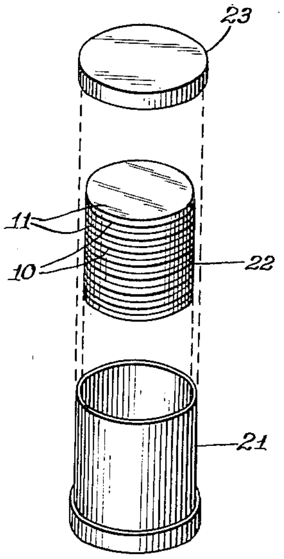
FIG. 2 is an exploded perspective view showing a container for alternate layers of germanium and decontaminating metal.
Figure 3:
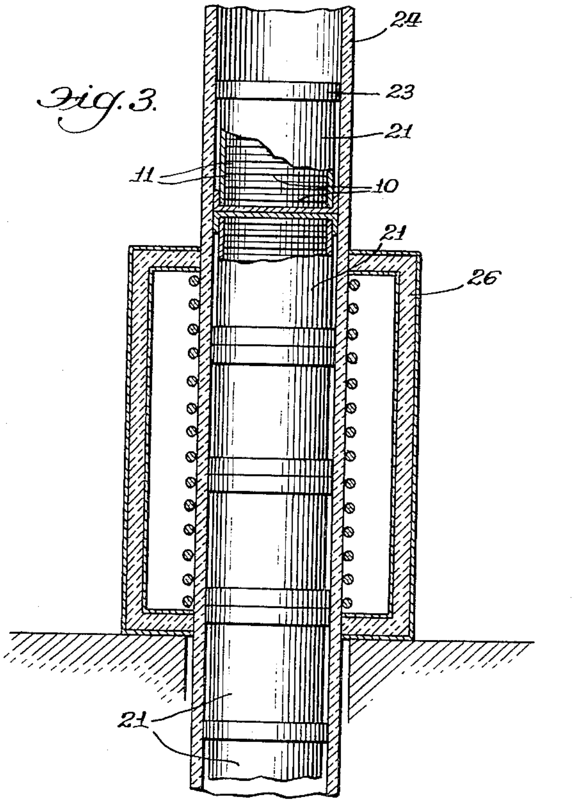
FIG. 3 is a sectional view illustrating the use of the container of FIG. 2 in a vertical tube furnace for large scale production of decontaminated germanium wafers.

The process of the invention is easily adapted to mass production techniques as by closing a stack of wafers to be treated interleaved with layers of molybdenum foil in a cylindrical molybdenum can 21 as shown in FIG. 2. The stack generally indicated at 22 fits inside the can which is closed by the molybdenum cover 23.

A plurality of loaded cans 21 can be processed by continuously moving them through a vertical tube 24 surrounded by a furnace 26. The interior of the tube 24 is preferably filled with hydrogen which diffuses sufficiently easily so that it can penetrate between the cover 23 and the cans 21 and contact the stack of wafers and foil contained in each can. The cans 21 are moved through the furnace zone 26 at a predetermined rate in accordance with well-known principles of operating vertical tube furnaces. Different temperature zones may be provided within the furnace 26 for the high temperature heating, the gradual cooling, and for the annealing operation discussed above.

With the decontamination process described above, bodies of germanium which have been subjected to a diffusion treatment at temperatures of the order of 800° C. are subsequently treated so as to remove undesired impurities from the germanium. This is accomplished without the use of highly poisonous material such as potassium cyanide and does not require individual coating of the germanium wafers prior to treatment. In addition, extensive washing of the material after decontamination, which is necessary when potassium cyanide is used in order to remove it, is eliminated. The process is easily adapted to mass production techniques using inexpensive and readily available equipment.

We claim:

1. A method for treating a body of thermally contaminated germanium in order to remove copper, nickel and iron impurities therefrom, said method comprising, contacting said germanium body with an oxidizing agent so as to oxidize a surface of said body, placing a body of molybdenum metal with a surface thereof in contact with said oxidized surface of said germanium body, heating the resulting assembly to a temperature in the range of 550° C. and 800° C. for at least 30 minutes, cooling said assembly and separating said germanium body from said molybdenum body.

2. A method of decontaminating germanium wafers which have been heat treated at a temperature in excess of 500° C., said method comprising, contacting the wafers with dilute nitric acid so as to oxidize the surface of the wafers, stacking a plurality of the oxidized wafers between sheets of molybdenum metal so that the stack has alternate layers of molybdenum and germanium in face-to-face contact with each other, heating the stack in an atmosphere which is substantially non-reactive with the molybdenum and the germanium to a temperature in the range of 50° C. to 800° C. for at least 30 minutes, cooling the stack in said non-reactive atmosphere at a controlled rate to a temperature of about 475° C., maintaining the stack at a temperature of about 475° C. for a time sufficient to anneal the wafers, cooling the assembly to room temperature and separating the germanium wafers from the molybdenum sheets.

3. A method of treating germanium wafers to remove copper, nickel and iron impurities therefrom including the steps of stacking a plurality of said wafers between sheets of molybdenum foil such that the stack has alternate layers of molybdenum and germanium in face-to-face contact, placing the resulting stack in a molybdenum container, subsequently heating said container in an atmosphere which is non-reactive with the germanium and the molybdenum to a temperature in the range of about 550° C. and about 800° C., and maintaining said container in said atmosphere within said temperature range for at least about 30 minutes to cause said impurities to diffuse out of said germanium wafers and into said sheets molybdenum foil.

4. A method of treating semiconductor material so as to provide such material for subsequent fabrication into semiconductor devices in a condition such that it does not contain copper, nickel and iron impurities to an extent which adversely affects the resistivity characteristics of the material, said method comprising oxidizing a surface of a body of said semiconductor material, placing a body of molybdenum with a surface thereof in direct face-to-face contact with said oxidized surface of said semiconductor body so that the resulting assembly is readily separable even after high temperature treatment thereof, heating said assembly in an atmosphere which is not adversely reactive with the semiconductor material and the molybdenum at a temperature below the melting point of the semiconductor material and above 550° C. for a time which is inversely proportionate to the temperature of heating, cooling said assembly and separating said semiconductor body from said molybdenum body.

5. A method of treating semiconductor material so as to avoid contamination of such material with copper, nickel and iron impurities to an extent which adversely affects the resistivity characteristics of the semiconductor material, said method comprising assembling a plurality of bodies of said semiconductor material between bodies of molybdenum metal such that the resulting assembly has successive bodies of molybdenum and semiconductor material in alternation and each in direct face-to-face contact with the adjoining body, heating the resulting assembly in an atmosphere which is not adversely reactive with the semiconductor material and the molybdenum at a temperature below the melting point of the semiconductor material and above 550° C. for a time which is inversely proportionate to the temperature of heating, cooling said assembly and separating said semiconductor bodies from said molybdenum bodies.

6. A method of treating a plurality of germanium bodies so as to condition such bodies for subsequent fabrication into semiconductor devices such that they do not contain copper, nickel and iron impurities to an extent which adversely affects the resistivity characteristics of the germanium material, said method comprising assembling said germanium bodies between bodies of molybdenum metal so that the resulting assembly has successive bodies of molybdenum and germanium in alternation and in direct contact with each other, heating said assembly in an atmosphere of non-oxidizing gas at a temperature in the range from 550° C. to 800° C. for a time which is inversely proportionate to the temperature of heating, cooling said assembly and separating said germanium bodies from said molybdenum bodies.

References Cited in the file of this patent

UNITED STATES PATENTS

| | | |
|---|---|---|
| 2,801,375 | Losco | July 30, 1957 |
| 2,813,233 | Shockley | Nov. 12, 1957 |
| 2,827,436 | Bemski | Mar. 18, 1958 |